(12) United States Patent
Lee et al.

(10) Patent No.: US 11,984,531 B2
(45) Date of Patent: May 14, 2024

(54) LIGHT EMITTING DEVICE AND WAFER

(71) Applicant: LG DISPLAY CO., LTD., Seoul (KR)

(72) Inventors: KooHwa Lee, Daegu (KR); WooNam Jeong, Paju-si (KR); HyeonHo Son, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 214 days.

(21) Appl. No.: 17/354,671

(22) Filed: Jun. 22, 2021

(65) Prior Publication Data

US 2022/0045238 A1 Feb. 10, 2022

(30) Foreign Application Priority Data

Aug. 6, 2020 (KR) .................. 10-2020-0098843

(51) Int. Cl.
*H01L 33/08* (2010.01)
*H01L 27/15* (2006.01)
*H01L 33/42* (2010.01)

(52) U.S. Cl.
CPC ............ *H01L 33/08* (2013.01); *H01L 27/156* (2013.01); *H01L 33/42* (2013.01)

(58) Field of Classification Search
CPC ........ H01L 33/08; H01L 33/42; H01L 27/156
See application file for complete search history.

(56) References Cited

U.S. PATENT DOCUMENTS

| 8,624,274 | B2* | 1/2014 | Hsueh | H01L 27/15 |
| | | | | 257/89 |
| 2008/0251799 | A1* | 10/2008 | Ikezawa | H01L 25/0756 |
| | | | | 257/89 |
| 2014/0284633 | A1* | 9/2014 | Tsay | H01L 27/153 |
| | | | | 257/88 |
| 2019/0165207 | A1* | 5/2019 | Kim | H01L 33/42 |
| 2021/0296528 | A1* | 9/2021 | Fujiwara | H01L 33/08 |

FOREIGN PATENT DOCUMENTS

KR 10-2020-0007738 A 1/2020

* cited by examiner

*Primary Examiner* — Mark W Tornow

(74) *Attorney, Agent, or Firm* — Morgan, Lewis & Bockius LLP

(57) ABSTRACT

Provided is a light emitting device. A light emitting device includes a first n-type semiconductor layer, a first light emitting layer disposed on the first n-type semiconductor layer, a first p-type semiconductor layer disposed on the first light emitting layer, a second p-type semiconductor layer disposed on the first p-type semiconductor layer, a bonding layer disposed between the first p-type semiconductor layer and the second p-type semiconductor layer, a second light emitting layer disposed on the second p-type semiconductor layer, a second n-type semiconductor layer disposed on the second light emitting layer, a p-type electrode disposed on the second p-type semiconductor layer, a first n-type electrode disposed on the first n-type semiconductor layer, and a second n-type electrode disposed on the second n-type semiconductor layer.

20 Claims, 14 Drawing Sheets

LED(LED1,LED2)

LIGHT EMITTING DEVICE AND WAFER

CROSS-REFERENCE TO RELATED APPLICATIONS

This application claims the priority of Korean Patent Application No. 10-2020-0098843 filed on Aug. 6, 2020, in the Korean Intellectual Property Office, the disclosure of which is incorporated herein by reference.

BACKGROUND

Technical Field

The present disclosure relates to a light emitting device and a wafer, and more particularly, to a wafer in which light emitting devices emitting red light, green light, and blue light are formed together on one substrate.

Discussion of the Related Art

Display apparatuses used in computer monitors, TVs, mobile phones, etc. include an organic light emitting display (OLED) or the like that emits light by itself and a liquid crystal display (LCD) or the like that requires a separate light source.

The display apparatuses are being applied in a wide range, not only to computer monitors and TVs but also to personal portable devices, and research is being conducted for a display apparatus having a large display area with reduced volume and weight.

Recently, a display apparatus including light emitting devices (LEDs) has been spotlighted as a next-generation display apparatus. The LED, which is formed of an inorganic material rather than an organic material, is superior in reliability and thus has a longer lifespan than the LCD or the OLED. In addition, the LED is capable of displaying a high-brightness image with excellent stability due to its fast lighting-up speed, excellent light-emitting efficiency, and strong resistance to impact.

SUMMARY

Accordingly, embodiments of the present disclosure are directed to a light emitting device and a wafer that substantially obviates one or more of the problems due to limitations and disadvantages of the related art.

An object to be achieved by the present disclosure is to provide a light emitting device capable of emitting light in one or more colors and a wafer.

Another object to be achieved by the present disclosure is to provide a light emitting device formed together with other light emitting devices emitting red light, green light, and blue light, and a wafer.

Another object to be achieved by the present disclosure is to provide a light emitting device and a wafer in which a plurality of light emitting devices emitting red light, green light, and blue light is formed on the wafer to simplify a process of transferring the plurality of light emitting devices.

Another object to be achieved by the present disclosure is to provide a light emitting device in which light emitting layers emitting light in different colors are stacked to reduce an area occupied by one light emitting device, and a wafer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light emitting device comprises a first n-type semiconductor layer, a first light emitting layer disposed on the first n-type semiconductor layer, a first p-type semiconductor layer disposed on the first light emitting layer, a second p-type semiconductor layer disposed on the first p-type semiconductor layer, a bonding layer disposed between the first p-type semiconductor layer and the second p-type semiconductor layer, a second light emitting layer disposed on the second p-type semiconductor layer, a second n-type semiconductor layer disposed on the second light emitting layer, a p-type electrode disposed on the second p-type semiconductor layer, a first n-type electrode disposed on the first n-type semiconductor layer, and a second n-type electrode disposed on the second n-type semiconductor layer. Therefore, since the first light emitting layer and the second light emitting layer emitting light in different colors are included in one light emitting device, one light emitting device may emit light in one or more colors.

In another aspect, a wafer comprises a substrate, and a plurality of light emitting devices disposed on the substrate. Each of the plurality of light emitting devices includes a first n-type semiconductor layer disposed on the substrate, a first light emitting layer disposed on the first n-type semiconductor layer, a p-type semiconductor layer disposed on the first light emitting layer, a second light emitting layer disposed on the p-type semiconductor layer, a second n-type semiconductor layer disposed on the second light emitting layer, a p-type electrode disposed on the p-type semiconductor layer, a first n-type electrode disposed on the first n-type semiconductor layer, and a second n-type electrode disposed on the second n-type semiconductor layer. Therefore, since the first light emitting layer and the second light emitting layer emitting light in different colors are disposed in a vertical direction, an area occupied by one light emitting device on the substrate may be reduced.

Other detailed matters of the exemplary embodiments are included in the detailed description and the drawings.

According to the present disclosure, red light and green light may be emitted together from one light emitting device, or red light and blue light may be emitted together from one light emitting device.

According to the present disclosure, a transfer process may be simplified and a cost may be reduced by forming light emitting devices emitting red light, green light, and blue light together on one wafer.

According to the present disclosure, an area occupied by one light emitting device may be reduced and space utilization may be facilitated by vertically stacking the light emitting layers emitting light in different colors.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
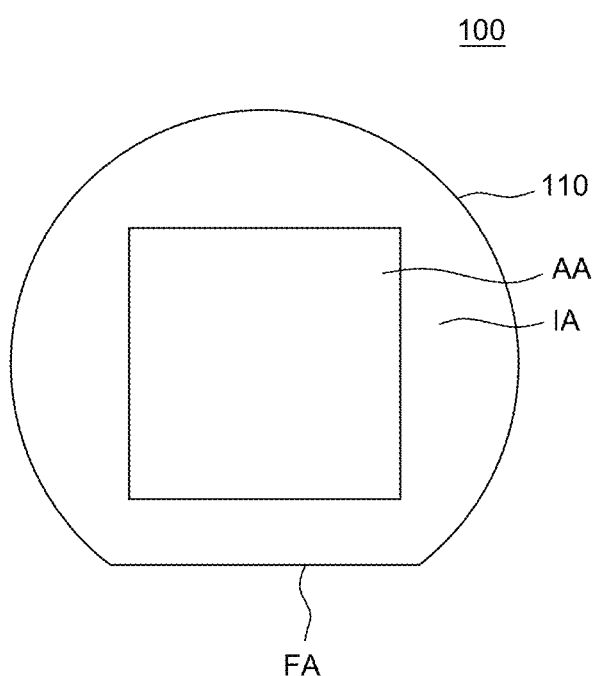
FIG. 1 is a plan view of a wafer according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting device and a wafer according to exemplary embodiments of the present disclosure will be described in detail with reference to accompanying drawings.

Figure 2:
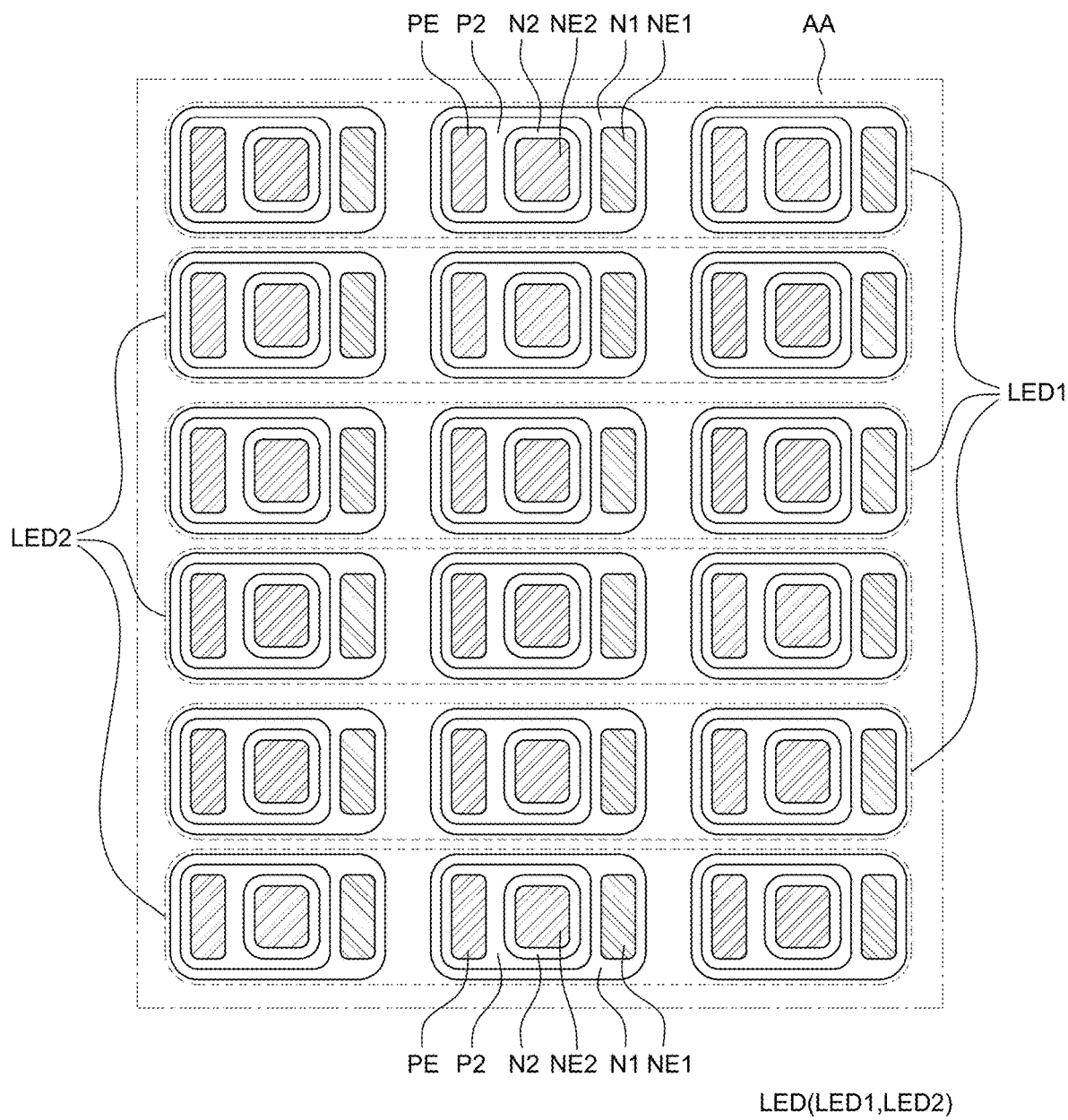
FIG. 2 is an enlarged plan view of the wafer according to an exemplary embodiment of the present disclosure.

FIG. 1 is a plan view of a wafer according to an exemplary embodiment of the present disclosure. FIG. 2 is an enlarged plan view of the wafer according to an exemplary embodiment of the present disclosure. Referring to FIGS. 1 and 2, the wafer 100 according to an exemplary embodiment of the present disclosure includes a substrate 110 and a plurality of light emitting devices LEDs.

The substrate 110 is configured to support various components included in the wafer 100. The plurality of light emitting devices LEDs is grown on the substrate 110. The substrate 110 may be formed of a material that varies depending on materials constituting the plurality of light emitting devices LEDs. For example, the substrate 110 may be formed of sapphire, gallium nitride GaN, silicon Si, silicon carbide SiC, or the like, but is not limited thereto.

Referring to FIG. 1, the substrate 110 includes an active area AA and an inactive area IA. The active area AA is an area in which the plurality of light emitting devices LEDs is formed, and the inactive area IA surrounding the active area AA is an area in which an alignment key or the like is disposed.

A flat area FA is disposed in a partial portion of an edge of the substrate 110. The flat area FA is a straight line portion of the edge of the substrate 110 that is formed in a circular shape. The flat area FA serves to distinguish a structure of the wafer 100. The flat area FA may be used to determine the verticality and horizontality of the wafer 100, and the flat area FA may be used as a reference line at the time of processing the wafer 100.

Referring to FIG. 2, the plurality of light emitting devices LEDs is disposed in the active area AA. The plurality of light emitting devices LEDs are semiconductor devices emitting light when a voltage is applied thereto. The light emitting devices LEDs may emit red light, green light, blue light, and the like, which may be combined to implement light in various colors including white.

The plurality of light emitting devices LEDs may be formed by forming materials constituting the plurality of light emitting devices LEDs, such gallium nitride GaN, on the substrate 110 to grow crystal layers, cutting the crystal layers into individual chips, and forming electrodes on the chips. A process of forming the plurality of light emitting devices LEDs will be described in detail below with reference to FIGS. 4A to 4G.

The plurality of light emitting devices LEDs includes a first light emitting device LED1 and a second light emitting device LED2. The first light emitting device LED1 is a light emitting device emitting red light and green light, and the second light emitting device LED2 is a light emitting device emitting red light and blue light.

The first light emitting device LED1 and the second light emitting device LED2 may be disposed at a predetermined interval on the substrate 110 to correspond to respective transfer positions in a display apparatus. Specifically, the red light, green light, and blue light emitted from the first light emitting device LED1 and the second light emitting device LED2 may be combined to display light in various colors. Thus, the first light emitting device LED1 emitting red light and green light and the second light emitting device LED2 emitting red light and blue light may be disposed adjacent to each other in the display apparatus to form one pixel. When the first light emitting device LED1 and the second light emitting device LED2 are formed adjacent to each other on the substrate 110 to correspond a location of one pixel, the first light emitting device LED1 and the second light emitting device LED2 may be transferred at once without having to separately transfer each of the first light emitting device LED1 and the second light emitting device LED2. Accordingly, the transfer process may be simplified. Thus, the first light emitting device LED1 and the second light emitting device LED2 may be disposed adjacent to each other in the same row or in the same column, and one first light emitting device LED1 and one second light emitting device LED2 adjacent to each other may correspond to one pixel. For example, a plurality of first light emitting devices LED1 may be disposed in odd ones of a plurality of rows, and a plurality of second light emitting devices LED2 may be disposed in even ones of the plurality of rows. The first light emitting devices LED1 and the second light emitting devices LED2 may be alternately disposed in a column direction. However, the plurality of light emitting devices LEDs may be arranged in various forms according to how a plurality of pixels is arranged in the display apparatus, and the arrangement of the plurality of light emitting devices LEDs is not limited to what is illustrated in FIG. 2.

Hereinafter, the plurality of light emitting devices LEDs will be described in detail with reference to FIGS. 3A to 3D.

Figure 3A:
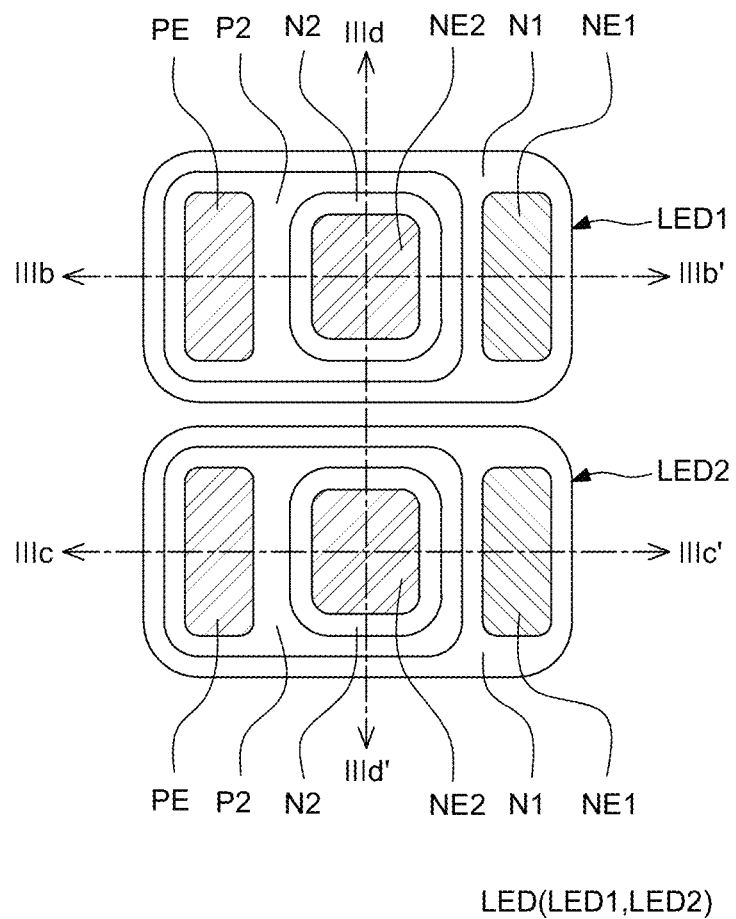
FIG. 3A is a plan view of a plurality of light emitting devices according to an exemplary embodiment of the present disclosure.
Figure 3B:
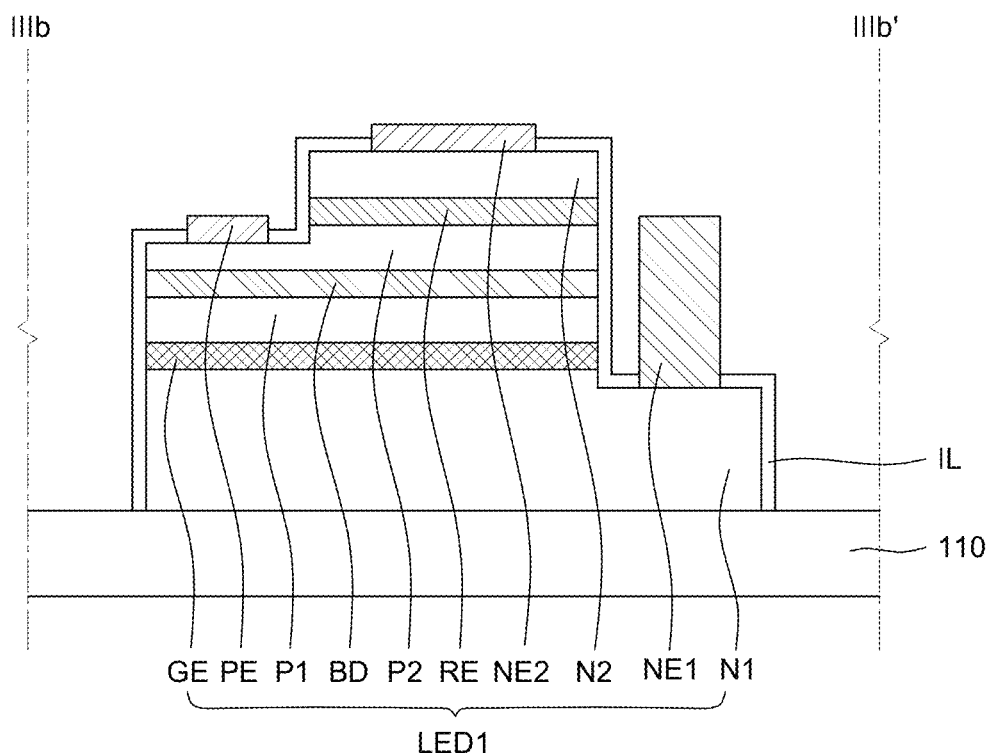
FIG. 3B is a cross-sectional view taken along line IIIb-IIIb' of FIG. 3A.
Figure 3C:
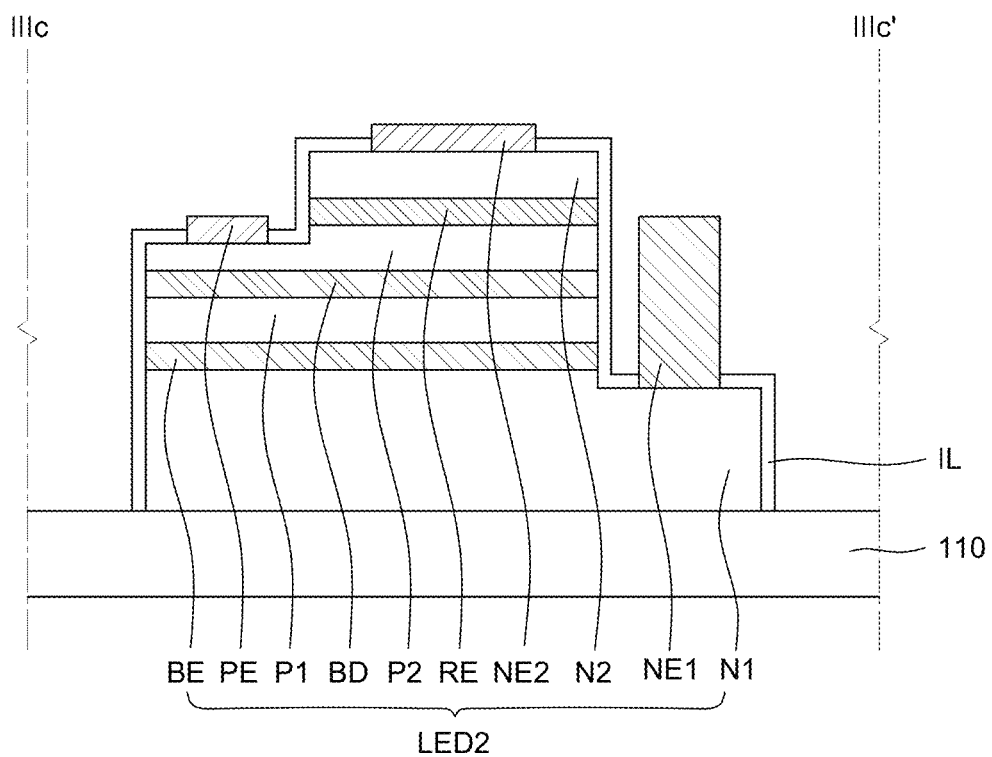
FIG. 3C is a cross-sectional view taken along line IIIc-IIIc' of FIG. 3A.
Figure 3D:
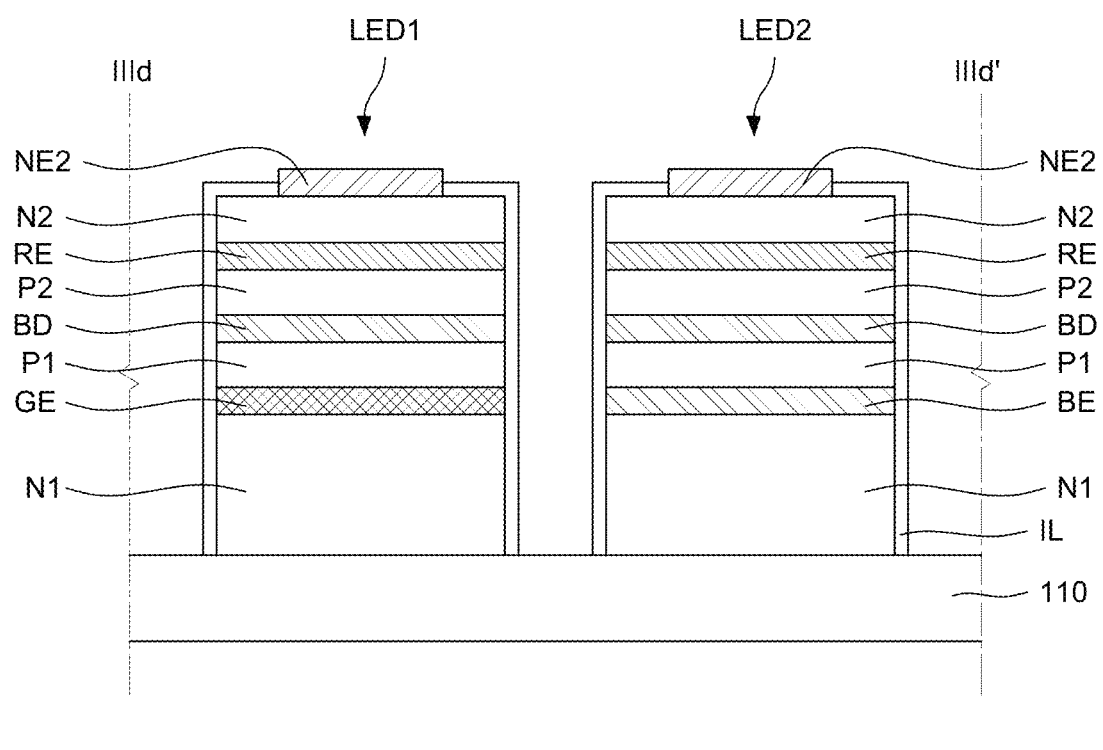
FIG. 3D is a cross-sectional view taken along line IIId-IIId' of FIG. 3A.

FIG. 3A is a plan view of a plurality of light emitting devices according to an exemplary embodiment of the present disclosure. FIG. 3B is a cross-sectional view taken along line IIIb-IIIb' of FIG. 3A. FIG. 3C is a cross-sectional view taken along line IIIc-IIIc' of FIG. 3A. FIG. 3D is a cross-sectional view taken along line IIId-IIId' of FIG. 3A.

Referring to FIGS. 3A, 3B, and 3D together, the first light emitting device LED1 among the plurality of light emitting devices LEDs includes a first n-type semiconductor layer N1, a first green light emitting layer GE, a first p-type semiconductor layer P1, a bonding layer BD, a second p-type semiconductor layer P2, a second light emitting layer RE, a second n-type semiconductor layer N2, a first n-type electrode NE1, a second n-type electrode NE2, and a p-type electrode PE.

The first n-type semiconductor layer N1 is disposed on the substrate 110, and the first p-type semiconductor layer P1 is disposed above the first n-type semiconductor layer N1. The first n-type semiconductor layer N1 and the first p-type semiconductor layer P1 may be formed by doping a specific material with n-type and p-type impurities, respectively. The first n-type semiconductor layer N1 may be formed by doping a material such as gallium nitride GaN with an n-type impurity, and the first p-type semiconductor layer P1 may be formed by doping a material such as gallium nitride GaN with a p-type impurity. For example, the n-type impurity may be silicon Si, germanium Ge, tin Sn, or the like, and the p-type impurity may be magnesium Mg, zinc Zn, beryllium Be, or the like, but the n-type and p-type impurities are not limited thereto.

The first green light emitting layer GE is disposed between the first n-type semiconductor layer N1 and the first p-type semiconductor layer P1. The first green light emitting layer GE may emit light by receiving holes and electrons that are supplied from the first n-type semiconductor layer N1 and the first p-type semiconductor layer P1. For example, the first green light emitting layer GE may emit green light by means of the holes and electrons supplied from the first n-type semiconductor layer N1 and the first p-type semiconductor layer P1. The first green light emitting layer GE may be formed in a single-layer structure or in a multi-quantum well (MQW) structure, and may be formed of, for example, indium gallium nitride InGaN or gallium nitride GaN, but is not limited thereto.

The second p-type semiconductor layer P2 is disposed above the first p-type semiconductor layer P1, and the second n-type semiconductor layer N2 is disposed above the second p-type semiconductor layer P2. The second n-type semiconductor layer N2 and the second p-type semiconductor layer P2 may be formed by doping a specific material with n-type and p-type impurities, respectively. The second n-type semiconductor layer N2 may be formed by doping a material such as aluminum indium phosphide AlInP or gallium arsenide GaAs with an n-type impurity, and the second p-type semiconductor layer P2 may be formed by doping a material such as gallium phosphide GaP with a p-type impurity. For example, the n-type impurity may be silicon Si, germanium Ge, tin Sn, or the like, and the p-type impurity may be magnesium Mg, zinc Zn, beryllium Be, or the like, but the n-type and p-type impurities are not limited thereto.

The second light emitting layer RE is disposed between the second p-type semiconductor layer P2 and the second n-type semiconductor layer N2. The second light emitting layer RE may emit light by receiving holes and electrons that are supplied from the second n-type semiconductor layer N2 and the second p-type semiconductor layer P2. For example, the second light emitting layer RE may emit red light by means of the holes and electrons supplied from the second n-type semiconductor layer N2 and the second p-type semiconductor layer P2. The second light emitting layer RE may be formed in a single-layer structure or in a multi-quantum well (MQW) structure, and may be formed of, for example, aluminum gallium indium phosphide AlGaInP, but is not limited thereto.

A partial portion of the first n-type semiconductor layer N1 protrudes outward beyond the first green light emitting layer GE, the first p-type semiconductor layer P1, the second p-type semiconductor layer P2, the second light emitting layer RE, and the second n-type semiconductor layer N2. The first green light emitting layer GE, the first p-type semiconductor layer P1, the second p-type semiconductor layer P2, the second light emitting layer RE, and the second n-type semiconductor layer N2 may have a smaller size than the first n-type semiconductor layer N1 to expose a top surface of the first n-type semiconductor layer N1. The partial portion of the first n-type semiconductor layer N1 may be exposed beyond the first green light emitting layer GE, the first p-type semiconductor layer P1, the second p-type semiconductor layer P2, the second light emitting layer RE, and the second n-type semiconductor layer N2 to be electrically connected to the first n-type electrode NE1. In this case, an entire portion of the first green light emitting layer GE, an entire portion of the first p-type semiconductor layer P1, an entire portion of the second p-type semiconductor layer P2, an entire portion of the second light emitting layer RE, and an entire portion of the second n-type semiconductor layer N2 may overlap a partial portion of the first n-type semiconductor layer N1.

A partial portion of the second p-type semiconductor layer P2 protrudes outward beyond the second light emitting layer RE and the second n-type semiconductor layer N2. The second light emitting layer RE and the second n-type semiconductor layer N2 may have a smaller size than the second p-type semiconductor layer P2 to expose a top surface of the second p-type semiconductor layer P2. The partial portion of the second p-type semiconductor layer P2 may be exposed beyond the second light emitting layer RE and the second n-type semiconductor layer N2 to be electrically connected to the p-type electrode PE. In addition, an entire portion of the second light emitting layer RE and an entire portion of the second n-type semiconductor layer N2 may overlap a partial portion of the second p-type semiconductor layer P2, a partial portion of the first p-type semiconductor layer P1, a partial portion of the first green light emitting layer GE, and a partial portion of the first n-type semiconductor layer N1.

The bonding layer BD is disposed between the first p-type semiconductor layer P1 and the second p-type semiconductor layer P2. The bonding layer BD, which is a member for bonding the first p-type semiconductor layer P1 and the second p-type semiconductor layer P2 to each other, may be formed of a transparent material. The bonding layer BD may be formed of a conductive material having a high transmittance, e.g. an anisotropic conductive film ACF or a metal mesh containing conductive particles. Accordingly, light emitted from the first green light emitting layer GE may be emitted upward of the second n-type semiconductor layer N2 after passing through the bonding layer BD having a high transmittance.

The first n-type electrode NE1 is disposed on the first n-type semiconductor layer N1, and the second n-type electrode NE2 is disposed on the second n-type semiconductor layer N2. The first n-type electrode NE1 may be in contact with the top surface of the first n-type semiconductor layer N1 exposed beyond the first green light emitting layer GE to be electrically connected to the first n-type semiconductor layer N1, and the second n-type electrode NE2 may be in contact with a top surface of the second n-type semiconductor layer N2 to be electrically connected to the second n-type semiconductor layer N2.

The p-type electrode PE is disposed on the second p-type semiconductor layer P2. The p-type electrode PE may be in contact with the second p-type semiconductor layer P2 exposed beyond the second light emitting layer RE to be electrically connected to the second p-type semiconductor layer P2. The p-type electrode PE may also be electrically connected to the first p-type semiconductor layer P1.

In this case, the bonding layer BD may be formed of a conductive material. When the bonding layer BD is formed of a conductive material, the p-type electrode PE contacting the second p-type semiconductor layer P2 may also be electrically connected to the first p-type semiconductor layer P1 through the bonding layer BD. For example, when the bonding layer BD is formed of a conductive material having a high transmittance, the first p-type semiconductor layer P1 and the second p-type semiconductor layer P2 may be electrically connected to each other through the bonding layer BD, and the p-type electrode PE contacting the second p-type semiconductor layer P2 may also be electrically connected to the first p-type semiconductor layer P1. Therefore, the p-type electrode PE may be electrically connected to both the first p-type semiconductor layer P1 and the second p-type semiconductor layer P2 by contacting the top surface of the second p-type semiconductor layer P2.

Meanwhile, the first n-type electrode NE1 may be thicker than the second n-type electrode NE2 and the p-type electrode PE. The first n-type electrode NE1 is disposed on the top surface of the first n-type semiconductor layer N1 that is closest to the substrate 110, and the p-type electrode PE is disposed on the top surface of the second p-type semiconductor layer P2 that is disposed above the first n-type semiconductor layer N1. In addition, the second n-type electrode NE2 is disposed on the top surface of the second n-type semiconductor layer N2 that is disposed on the uppermost side. Thus, the first n-type electrode NE1 may be disposed to be closer to the substrate 110 than the second n-type electrode NE2 and the p-type electrode PE, which causes differences in height level between the first n-type electrode NE1, the second n-type electrode NE2, and the p-type electrode PE. If there are differences in height level between the first n-type electrode NE1, the second n-type electrode NE2, and the p-type electrode PE, the plurality of light emitting devices LEDs may be distorted in the process of transferring the plurality of light emitting devices LEDs. Thus, the differences in height level between the first n-type electrode NE1, the second n-type electrode NE2, and the p-type electrode PE may be minimized by forming the first n-type electrode NE1 to be thicker than the second n-type electrode NE2 and the p-type electrode PE.

In this case, the second n-type electrode NE2, which overlaps the first green light emitting layer GE and the second light emitting layer RE, and the p-type electrode PE, which overlaps the first green light emitting layer GE, may be formed of a transparent conductive material, e.g. tin oxide TO, indium tin oxide ITO, indium zinc oxide IZO, or indium tin zinc oxide ITZO. In addition, even if the first n-type electrode NE1 is formed of an opaque conductive material, the first n-type electrode NE1, which does not overlap the first green light emitting layer GE and the second light emitting layer RE, may not interfere with propagation of light emitted from the first green light emitting layer GE and the second light emitting layer RE. Thus, the first n-type electrode NE1 may be formed of an opaque conductive material that can be formed to have a large thickness, e.g. gold Au.

Meanwhile, the first green light emitting layer GE and the second light emitting layer RE may emit light independently from each other. As an example, when a voltage is applied only to the first n-type electrode NE1 and the p-type electrode PE among the first n-type electrode NE1, the second n-type electrode NE2, and the p-type electrode PE, the first green light emitting layer GE may emit light through the first n-type semiconductor layer N1 electrically connected to the first n-type electrode NE1 and the first p-type semiconductor layer P1 electrically connected to the p-type electrode PE, while the second light emitting layer RE does not emit light because no voltage is applied to the second n-type electrode NE2. As another example, when a voltage is applied only to the second n-type electrode NE2 and the p-type electrode PE among the first n-type electrode NE1, the second n-type electrode NE2, and the p-type electrode PE, the second light emitting layer RE may emit light through the second n-type semiconductor layer N2 electrically connected to the second n-type electrode NE2 and the second p-type semiconductor layer P2 electrically connected to the p-type electrode PE, while the first green light emitting layer GE does not emit light because no voltage is applied to the first n-type electrode NE1. As another example, when a voltage is applied to all of the first n-type electrode NE1, the second n-type electrode NE2, and the p-type electrode PE, the first green light emitting layer GE and the second light emitting layer RE may emit light simultaneously. Thus, the first green light emitting layer GE and the second light emitting layer RE may be controlled to emit light independently from each other by selectively applying a voltage to the first n-type electrode NE1 and the second n-type electrode NE2 while applying the voltage to the p-type electrode PE.

Next, an insulating layer IL surrounding the first light emitting device LED1 is disposed. In order to avoid an electrical short of each of the first n-type semiconductor layer N1, the first p-type semiconductor layer P1, the second p-type semiconductor layer P2, and the second n-type semiconductor layer N2, the insulating layer IL may be disposed to surround a partial portion of the first light emitting device LED1. Specifically, the insulating layer IL may cover an entire portion of a side surface and a partial portion of a top surface of the first n-type semiconductor layer N1, an entire portion of a side surface of the first green light emitting layer GE, an entire portion of a side surface of the first p-type semiconductor layer P1, an entire portion of a side surface of the bonding layer BD, an entire portion of a side surface and a partial portion of a top surface of the second p-type semiconductor layer P2, an entire portion of a side surface of the second light emitting layer RE, and an entire portion of a side surface and a partial portion of a top surface of the second n-type semiconductor layer N2.

Referring to FIGS. 3A, 3C, and 3D together, the second light emitting device LED2 among the plurality of light emitting devices LEDs includes a first n-type semiconductor layer N1, a first blue light emitting layer BE, a first p-type semiconductor layer P1, a bonding layer BD, a second p-type semiconductor layer P2, a second light emitting layer RE, a second n-type semiconductor layer N2, a first n-type electrode NE1, a second n-type electrode NE2, and a p-type electrode PE. The second light emitting device LED2 substantially has the same configuration as the first light emitting device LED1, except that the first blue light emitting layer BE is included instead of the first green light emitting layer GE.

The first blue light emitting layer BE is disposed between the first n-type semiconductor layer N1 and the first p-type semiconductor layer P1. The first blue light emitting layer BE may emit light by receiving holes and electrons that are supplied from the first n-type semiconductor layer N1 and the first p-type semiconductor layer P1. For example, the first blue light emitting layer BE may emit blue light by means of the holes and electrons supplied from the first n-type semiconductor layer N1 and the first p-type semiconductor layer P1. The first blue light emitting layer BE may be formed in a single-layer structure or in a multi-quantum well (MQW) structure, and may be formed of, for example, indium gallium nitride InGaN or gallium nitride GaN, but is not limited thereto.

Hereinafter, a method of manufacturing a wafer 100 according to an exemplary embodiment of the present disclosure will be described with reference to FIGS. 4A to 4G.

FIGS. 4A to 4G are process diagrams for explaining a method of manufacturing the wafer according to an exemplary embodiment of the present disclosure. Specifically, FIGS. 4A to 4G are schematic cross-sectional views for explaining a process of forming a plurality of light emitting devices LEDs on a substrate 110.

Figure 4A:
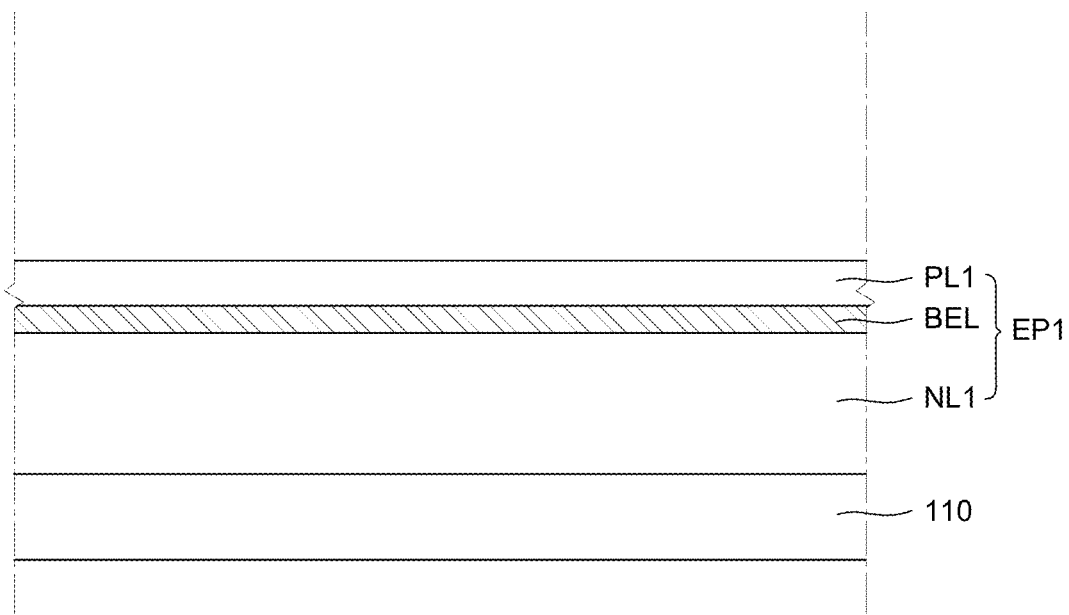
FIGS. 4A to 4G are process diagrams for explaining a method of manufacturing the wafer according to an exemplary embodiment of the present disclosure.

Referring to FIG. 4A, a first epitaxial layer EP1 is formed on the substrate 110. The first epitaxial layer EP1 is provided to form a plurality of light emitting devices LEDs. In the first epitaxial layer EP1, materials constituting each of a first n-type semiconductor layer N1, a first green light emitting layer GE and a first p-type semiconductor layer P1 or each of a first n-type semiconductor layer N1, a first blue light emitting layer BE, and a first p-type semiconductor layer P1 may be sequentially stacked. In the following description, for convenience of explanation, it is assumed that the first epitaxial layer EP1 includes a material constituting the first blue light emitting layer BE. However, the first epitaxial layer EP1 may include a material constituting the first green light emitting layer GE, and is not limited thereto.

First, a first n-type semiconductor material layer NL1 may be formed by growing a semiconductor crystal on the substrate 110. Subsequently, a first blue light emitting material layer BEL and a first p-type semiconductor material layer PL1 may be formed by growing semiconductor crystals on the first n-type semiconductor material layer NL1. In this case, the first blue light emitting material layer BEL may be grown by inheriting the crystallinity of the first n-type semiconductor material layer NL1, and the first p-type semiconductor material layer PL1 grown on the first blue light emitting material layer BEL may be grown by inheriting the crystallinity of the first blue light emitting material layer BEL. That is, the first epitaxial layer EP1 may be formed by sequentially growing the first n-type semiconductor material layer NL1, the first blue light emitting material layer BEL, and the first p-type semiconductor material layer PL1 on the substrate 110.

In this case, the first epitaxial layer EP1 may be grown on the substrate 110 by a metal organic chemical vapor deposition (MOCVD) method, a sputtering method, or the like, but the method of growing the first epitaxial layer EP1 is not limited thereto.

Figure 4B:
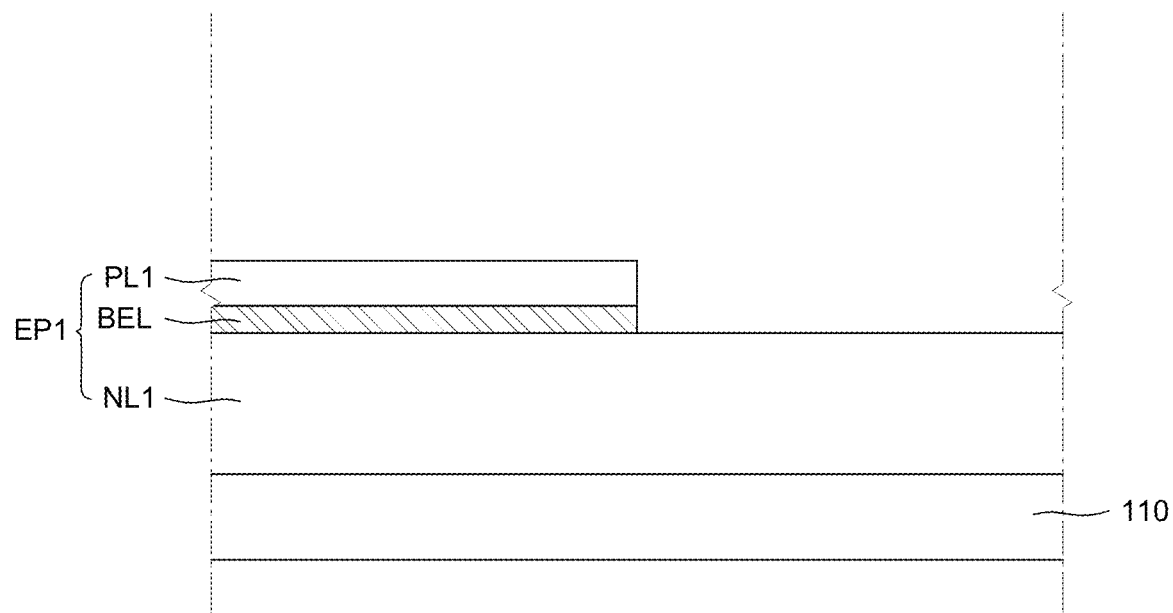

Subsequently, referring to FIG. 4B, a partial portion of each of the first p-type semiconductor material layer PL1 and the first blue light emitting material layer BEL is removed, the removed partial portion overlapping an area where first light emitting devices LED1 among the plurality of light emitting devices LEDs are to be formed. Accordingly, only the first n-type semiconductor material layer NL1 may be disposed on a partial area of the substrate 110 overlapping the area where the first light emitting devices LED1 are to be formed, while the first n-type semiconductor material layer NL1, the first blue light emitting material layer BEL, and the first p-type semiconductor material layer PL1 may be disposed on the other partial area of the substrate 110 overlapping an area where second light emitting devices LED2 are to be formed.

Figure 4C:
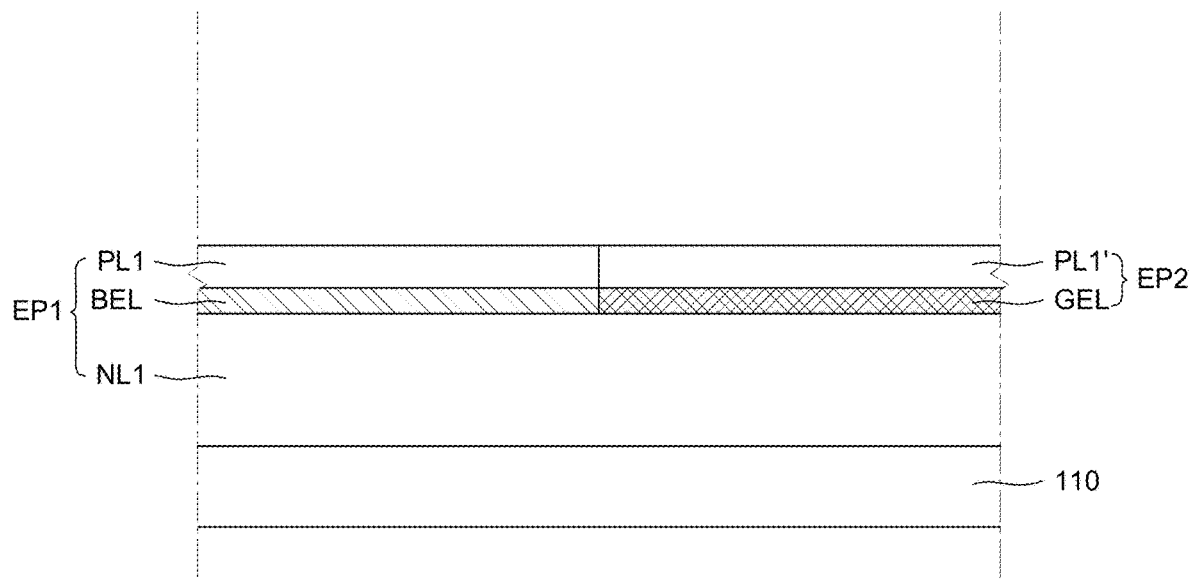

Subsequently, referring to FIG. 4C, a second epitaxial layer EP2 is formed on the substrate 110. In the second epitaxial layer EP2, respective materials constituting the first green light emitting layer GE and the first p-type semiconductor layer P1 may be sequentially stacked.

First, a first green light emitting material layer GEL may be formed by growing a semiconductor crystal on the substrate 110. Subsequently, a first p-type semiconductor material layer PL1' may be formed by growing a semiconductor crystal on the first green light emitting material layer GEL.

Meanwhile, the second epitaxial layer EP2 may be formed over an entire surface of the substrate 110. The first green light emitting material layer GEL and the first p-type semiconductor material layer PL1' may be formed over the entire surface of the substrate 110 to cover the first p-type semiconductor material layer PL1 and the first n-type semiconductor material layer NL1 of the first epitaxial layer EP1. In this case, a partial portion of the second epitaxial layer EP2 formed on the first p-type semiconductor material layer PL1 of the first epitaxial layer EP1 may be removed for a process of bonding a third epitaxial layer EP3, which will be described below. The reason for removing the partial portion of the second epitaxial layer EP2 formed on the first p-type semiconductor material layer PL1 of the first epitaxial layer EP1 is that top surfaces of the first p-type semiconductor material layer PL1 of the first epitaxial layer EP1 and the first p-type semiconductor material layer PL1' of the second epitaxial layer EP2 need to be coplanar in order to bond the third epitaxial layer EP3 to the first epitaxial layers EP1 and second epitaxial layers EP2. Accordingly, only the first green light emitting material layer GEL and the first p-type semiconductor material layer PL1' of the second epitaxial layer EP2 formed on the first n-type semiconductor material layer Nil of the first epitaxial layer EP1 may remain on the substrate 110.

Alternatively, the second epitaxial layer EP2 may be formed only on the first n-type semiconductor material layer Nil exposed beyond the first blue light emitting material layer BEL. The first green light emitting material layer GEL and the first p-type semiconductor material layer PL1' of the second epitaxial layer EP2 may be formed to cover only the first n-type semiconductor material layer NL1 of the first epitaxial layer EP1. For example, the second epitaxial layer EP2 may be grown only on the first n-type semiconductor material layer NL1, after forming a separate insulating film covering the first p-type semiconductor material layer PL1 of the first epitaxial layer EP1 so that the second epitaxial layer EP2 cannot be grown on the first p-type semiconductor material layer PL1 of the first epitaxial layer EP1. When the second epitaxial layer EP2 is grown only on the first n-type semiconductor material layer NL1 of the first epitaxial layer EP1, the process of removing the partial portion of the second epitaxial layer EP2 covering the first p-type semiconductor layer P1 of the first epitaxial layer EP1 may be omitted. However, the growth area of the second epitaxial layer EP2 may vary depending on design, not being limited to what is described above.

Thus, the respective materials constituting the first n-type semiconductor layer N1, the first blue light emitting layer BE, and the first p-type semiconductor layer P1 of the second light emitting device LED2, and the first n-type semiconductor layer N1 of the first light emitting device LED1 may be formed by growing the first epitaxial layer EP1 on the substrate 110, and the respective materials constituting the first green light emitting layer GE and the first p-type semiconductor layer P1 of the first light emitting device LED1 may be formed by growing the second epitaxial layer EP2 on the substrate 110.

Figure 4D:
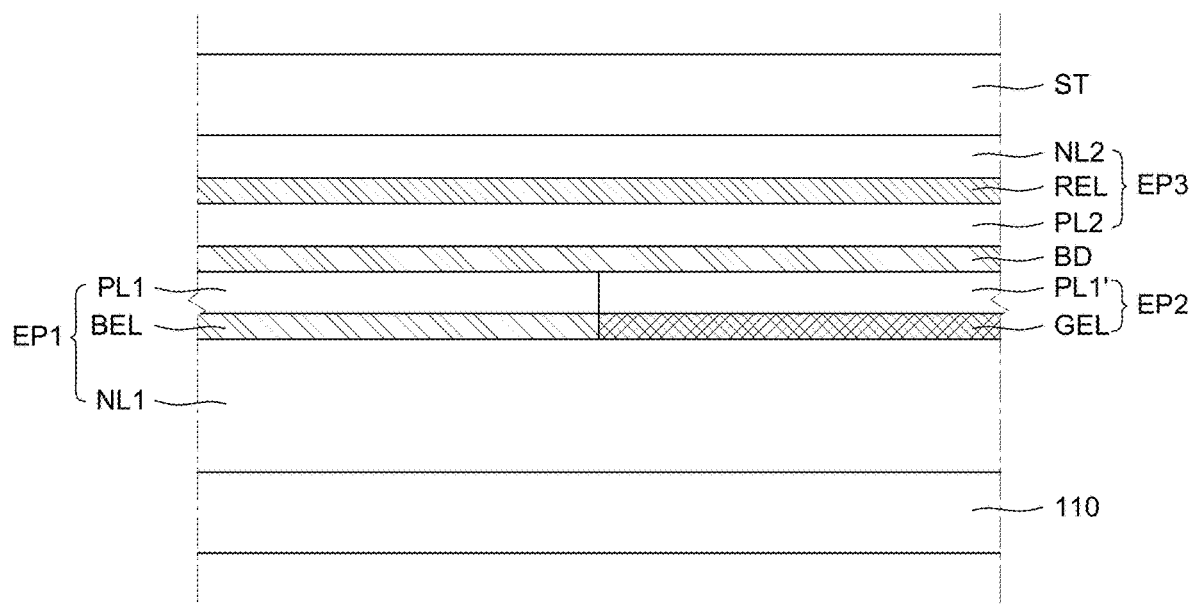

Subsequently, referring to FIG. 4D, the third epitaxial layer EP3 is bonded onto the first and second epitaxial layers EP1 and EP2. After forming a bonding layer BD between the first and second epitaxial layers EP1 and EP2 and the third epitaxial layer EP3, the third epitaxial layer EP3 may be bonded to the first epitaxial layer EP1 and the second epitaxial layer EP2.

First, the third epitaxial layer EP3 may be formed on a temporary substrate ST to form the plurality of light emitting devices LEDs. In the third epitaxial layer EP3, respective materials constituting a second n-type semiconductor layer N2, a second light emitting layer RE, and a second p-type semiconductor layer P2 may be sequentially stacked.

A second n-type semiconductor material layer NL2 may be formed by growing a semiconductor crystal on the temporary substrate ST. Subsequently, a second light emitting material layer REL and a second p-type semiconductor material layer PL2 may be formed by growing semiconductor crystals on the second n-type semiconductor material layer NL2. Thus, the third epitaxial layer EP3 may be formed by sequentially growing the second n-type semiconductor material layer NL2, the second light emitting material layer REL, and the second p-type semiconductor material layer PL2 on the temporary substrate ST.

In this case, the third epitaxial layer EP3 may be formed on the temporary substrate ST that is different from the substrate 110 on which the first epitaxial layer EP1 and the second epitaxial layer EP2 are grown, because of the growth efficiency of the third epitaxial layer EP3. Specifically, the first epitaxial layer EP1, the second epitaxial layer EP2, and the third epitaxial layer EP3, each including a light emitting material layer emitting light in a different color from the others, may vary in growth efficiency depending on what type of substrate 110 is used. As an example, when the substrate 110 is a gallium nitride substrate or a sapphire substrate, the first epitaxial layer EP1 and the second epitaxial layer EP2 including the first blue light emitting material layer BEL and the first green light emitting material layer GEL, respectively, may be easily grown on the substrate 110, whereas the third epitaxial layer EP3 including the second light emitting material layer REL, which emits red light, may be difficult to grow on the gallium nitride substrate or the sapphire substrate due to its low growth efficiency thereon. As another example, when the substrate 110 is a gallium arsenide substrate or a gallium phosphorus substrate, the third epitaxial layer EP3 including the second light emitting material layer REL, which emits red light, may be efficiently grown on the substrate 110. Thus, the first epitaxial layer EP1 and the second epitaxial layer EP2 may be grown on one substrate 110, and the third epitaxial layer EP3 may be grown on the temporary substrate ST that is different from the substrate 110 on which the first epitaxial layer EP1 and the second epitaxial layer EP2 are grown.

Next, the bonding layer BD may be formed on an upper side of the third epitaxial layer EP3 or on upper sides of the first epitaxial layer EP1 and the second epitaxial layer EP2. For example, the bonding layer BD may be formed on the second p-type semiconductor material layer PL2 of the third epitaxial layer EP3, or the bonding layer BD may be formed on the first p-type semiconductor material layers PL1 and PL1' of the first epitaxial layer EP1 and the second epitaxial layer EP2.

Subsequently, after positioning the temporary substrate ST so that the third epitaxial layer EP3 faces the first epitaxial layer EP1 and the second epitaxial layer EP2, the third epitaxial layer EP3 may be bonded to the first epitaxial layer EP1 and the second epitaxial layer EP2. After positioning the temporary substrate ST and the substrate 110 so that the second p-type semiconductor material layer PL2 of the third epitaxial layer EP3 and the first p-type semiconductor material layers PL1 and PL1' of the first and second epitaxial layers EP1 and EP2 face each other with the bonding layer BD interposed therebetween, the first and second epitaxial layers EP1 and EP2 and the third epitaxial layer EP3 may be bonded to each other by joining the substrate 110 and the temporary substrate ST together.

Figure 4E:
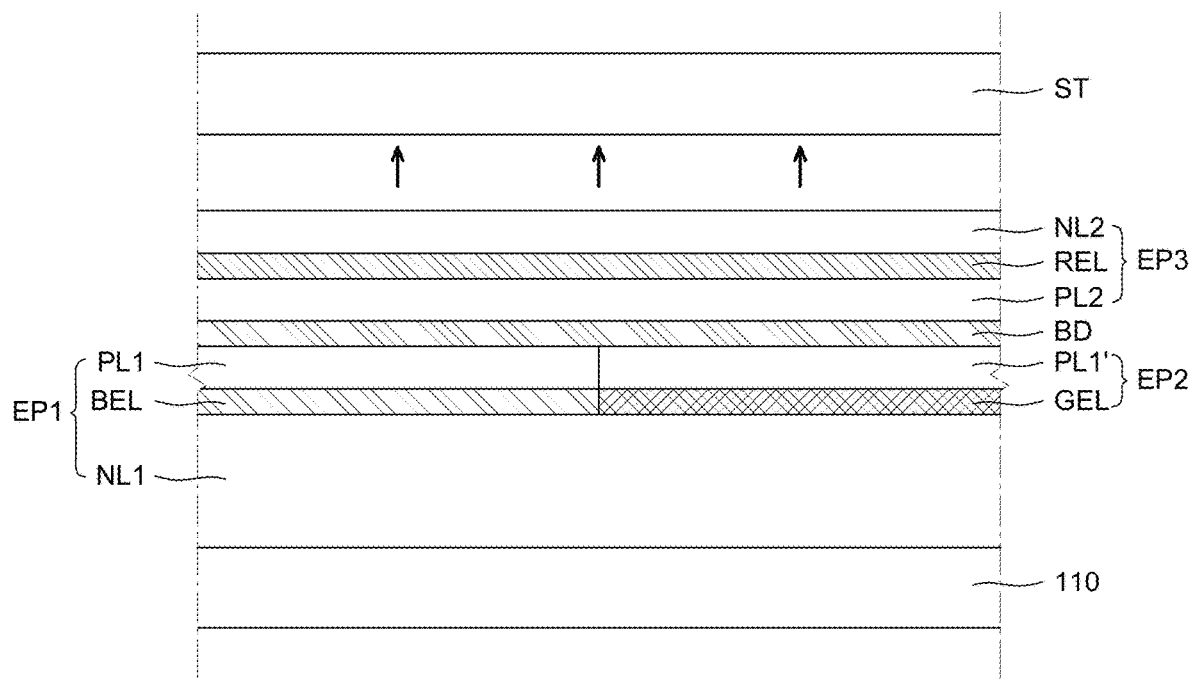

Referring to FIG. 4E, after completing the bonding between the first and second epitaxial layers EP1 and EP2 and the third epitaxial layer EP3, the temporary substrate ST is removed. The temporary substrate ST may be separated from the third epitaxial layer EP3. For example, the temporary substrate ST may be separated from the third epitaxial layer EP3 using a laser lift-off (LLO) technique.

According to the laser lift-off technique, when the temporary substrate ST is irradiated with a laser, laser absorption occurs at an interface between the second n-type semiconductor material layer NL2 and the temporary substrate ST, thereby separating the temporary substrate ST from the second n-type semiconductor material layer NL2. The temporary substrate ST may be separated by a method other than the laser lift-off method, but the method for separating the temporary substrate ST is not limited thereto.

Figure 4F:
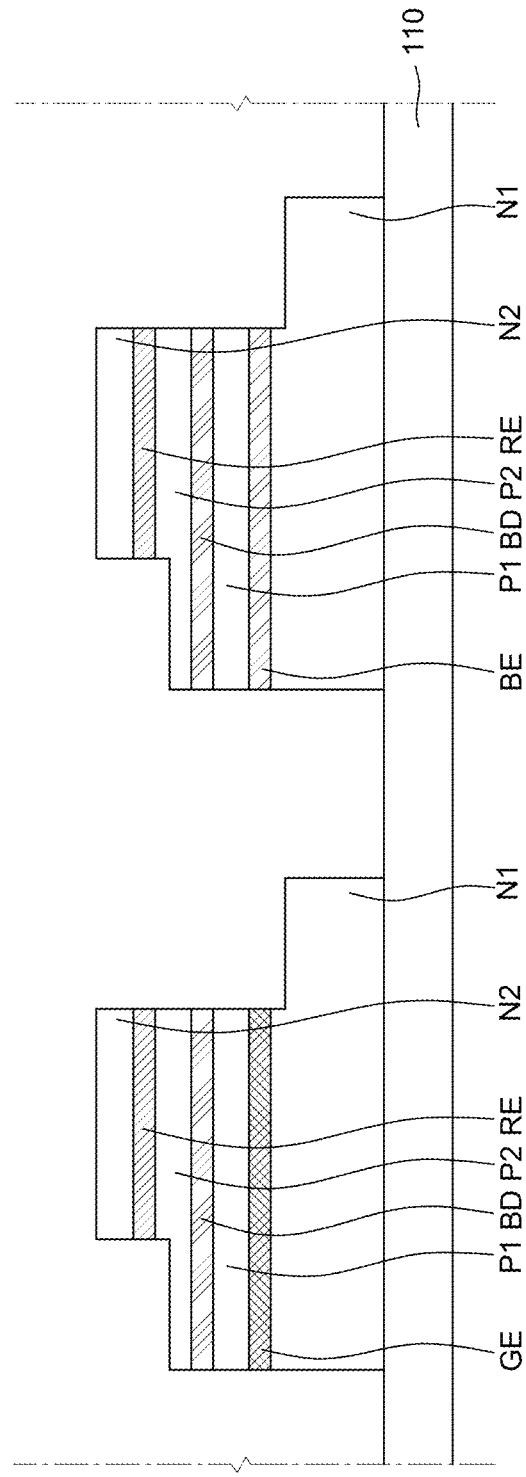

Next, referring to FIG. 4F, partial portions of the first epitaxial layer EP1, the second epitaxial layer EP2, and the third epitaxial layer EP3 are etched. A first n-type semiconductor layer N1, a first green light emitting layer GE, a first p-type semiconductor layer P1, a bonding layer BD, a second p-type semiconductor layer P2, a second light emitting layer RE, and a second n-type semiconductor layer N2 of the first light emitting device LED1 may be formed by etching the first epitaxial layer EP1, the second epitaxial layer EP2, and the third epitaxial layer EP3. Also, a first n-type semiconductor layer N1, a first blue light emitting layer BE, a first p-type semiconductor layer P1, a bonding layer BD, a second p-type semiconductor layer P2, a second light emitting layer RE, and a second n-type semiconductor layer N2 of the second light emitting device LED2 may be formed by etching the first epitaxial layer EP1, the second epitaxial layer EP2, and the third epitaxial layer EP3.

First, the second n-type semiconductor layer N2 and the second light emitting layer RE for each of the first light emitting device LED1 and the second light emitting device LED2 may be formed by etching the second n-type semiconductor material layer NL2 and the second light emitting material layer REL of the third epitaxial layer EP3.

Subsequently, the second p-type semiconductor layer P2, the bonding layer BD, the first p-type semiconductor layer P1, and the first green light emitting layer GE of the first light emitting device LED1 may be formed by etching the second p-type semiconductor material layer PL2, the bonding layer BD, the first p-type semiconductor material layer PL1', and the first green light emitting material layer GEL exposed beyond the second n-type semiconductor layer N2 and the second light emitting layer RE. Also, the second p-type semiconductor layer P2, the bonding layer BD, the first p-type semiconductor layer P1, and the first blue light emitting layer BE of the second light emitting device LED2 may be formed by etching the same width of the second p-type semiconductor material layer PL2, the bonding layer BD, the first p-type semiconductor material layer PL1, and the first blue light emitting material layer BEL exposed beyond the second n-type semiconductor layer N2 and the second light emitting layer RE.

Next, the respective first n-type semiconductor layers N1 of the first light emitting device LED1 and the second light emitting device LED2 may be formed by etching the first n-type semiconductor material layer NL1 exposed beyond the first green light emitting layer GE and the first blue light emitting layer BE.

Thus, by etching the partial portions of the first epitaxial layer EP1, the second epitaxial layer EP2, and the third epitaxial layer EP3, the first n-type semiconductor layer N1, the first green light emitting layer GE, the first p-type semiconductor layer P1, the bonding layer BD, the second p-type semiconductor layer P2, the second light emitting layer RE, and the second n-type semiconductor layer N2 of the first light emitting device LED1 may be formed, and the first n-type semiconductor layer N1, the first blue light emitting layer BE, the first p-type semiconductor layer P1, the bonding layer BD, the second p-type semiconductor layer P2, the second light emitting layer RE, and the second n-type semiconductor layer N2 of the second light emitting device LED2 may be formed.

Figure 4G:
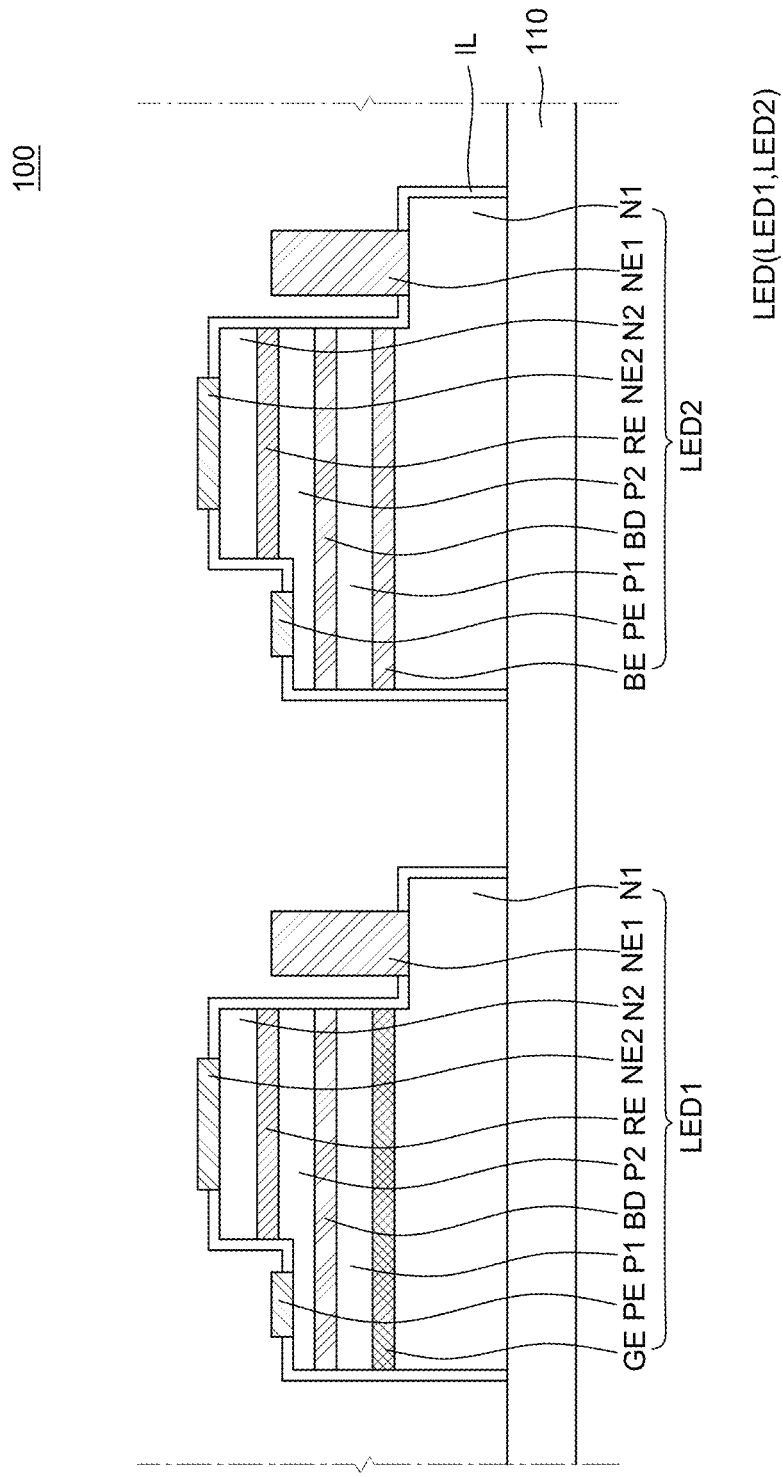

Lastly, referring to FIG. 4G, a first n-type electrode NE1, a second n-type electrode NE2, a p-type electrode PE, and an insulating layer IL are formed for each of the plurality of light emitting devices LEDs.

In the first light emitting device LED1, the first n-type electrode NE1 may be formed on the first n-type semiconductor layer N1, the second n-type electrode NE2 may be formed on the second n-type semiconductor layer N2, and the p-type electrode PE may be formed on the second p-type semiconductor layer P2. In this case, the first n-type electrode NE1, which is disposed to be closest to the substrate 110 among the first n-type electrode NE1, the second n-type electrode NE2, and the p-type electrode PE without overlapping the first green light emitting layer GE and the second light emitting layer RE, may be formed of an opaque conductive material that can be formed to have a large thickness, e.g. gold, to reduce a difference in height level. The second n-type electrode NE2, which overlaps the first green light emitting layer GE and the second light emitting layer RE, and the p-type electrode PE, which overlaps the first green light emitting layer GE, may be formed of a transparent material, e.g. indium tin oxide, to allow light emitted from the first green light emitting layer GE and the second light emitting layer RE to be transmitted therethrough. Since the first n-type electrode NE1 is formed of a different material with a different thickness from the second n-type electrode NE2 and the p-type electrode PE, a process of forming the first n-type electrode NE1 may be performed separately from a process of forming the second n-type electrode NE2 and the p-type electrode PE. In this case, the orders of the process of forming the first n-type electrode NE1 and the process of forming the second n-type electrode NE2 and the p-type electrode PE may vary depending on design.

In the second light emitting device LED2, like the first light emitting device LED1, the first n-type electrode NE1 may be formed on the first n-type semiconductor layer N1, the second n-type electrode NE2 may be formed on the second n-type semiconductor layer N2, and the p-type electrode PE may be formed on the second p-type semiconductor layer P2. In this case, the first n-type electrode NE1, which is disposed to be closest to the substrate 110 among the first n-type electrode NE1, the second n-type electrode NE2, and the p-type electrode PE without overlapping the first blue light emitting layer BE and the second light emitting layer RE, may be formed of an opaque material, e.g. gold, with a relatively large thickness. The second n-type electrode NE2, which overlaps the first blue light emitting layer BE and the second light emitting layer RE, and the p-type electrode PE, which overlaps the first blue light emitting layer BE, may be formed of a transparent material, e.g. indium tin oxide, to allow light emitted from the first blue light emitting layer BE and the second light emitting layer RE to be transmitted therethrough.

In addition, the first n-type electrode NE1 of the first light emitting device LED1 and the first n-type electrode NE1 of the second light emitting device LED2 may be formed of the same material in the same process, and the second n-type electrode NE2 and the p-type electrode PE of the first light emitting device LED1 and the second n-type electrode NE2 and the p-type electrode PE of the second light emitting device LED2 may also be formed of the same material in the same process.

Subsequently, the insulating layer IL surrounding each of the first light emitting device LED1 and the second light emitting device LED2 is formed. The insulating layer IL may cover each of the first light emitting device LED1 and the second light emitting device LED2, except respective partial portions of the first n-type electrode NE1, the second n-type electrode NE2, and the p-type electrode PE of each of the first light emitting device LED1 and the second light emitting device LED2.

Meanwhile, the insulating layer IL may be formed before forming the first n-type electrode NE1, the second n-type electrode NE2, and the p-type electrode PE of each of the first light emitting device LED1 and the second light emitting device LED2, or may be formed after forming the first n-type electrode NE1, the second n-type electrode NE2, and the p-type electrode PE of each of the first light emitting device LED1 and the second light emitting device LED2. As an example, after forming the insulating layer IL covering the first n-type semiconductor layer N1, the first green light emitting layer GE and the first blue light emitting layer BE, the first p-type semiconductor layer P1, the bonding layer BD, the second p-type semiconductor layer P2, the second light emitting layer RE, and the second n-type semiconductor layer N2 for each of the first and second light emitting devices LED1 and LED2, contact holes may be formed to expose partial portions of the top surfaces of the first n-type semiconductor layer N1, the second n-type semiconductor layer N2, and the second p-type semiconductor layer P2. Then, the first n-type electrode NE1, the second n-type electrode NE2, and the p-type electrode PE may be formed to fill the contact holes formed in the insulating layer IL, thereby completing the formation of the wafer 100 in which the first light emitting device LED1 and the second light emitting device LED2 are formed. As another example, in a state where all of the first n-type electrode NE1, the second n-type electrode NE2, and the p-type electrode PE are formed for each of the first and second light emitting devices LED1 and LED2, the insulating layer IL may be formed over the entire surface of the substrate 110 with contact holes formed therein to expose the first n-type electrode NE1, the second n-type electrode NE2, and the p-type electrode PE from the insulating layer IL, thereby completing the formation of the wafer 100 in which the first light emitting device LED1 and the second light emitting device LED2 are formed. However, it may vary depending on design which order the insulating layer IL is formed in, not being limited to what is described above.

In the wafer 100 according to an exemplary embodiment of the present disclosure, the plurality of light emitting devices LEDs emitting red light, green light, and blue light may be formed on one substrate 110 together, thereby simplifying a transfer process. The first light emitting device LED1 and the second light emitting device LED2 may be formed on one substrate 110 together, the first light emitting device LED1 including the first green light emitting layer GE, which emits green light, and the second light emitting layer RE, which emits red light, and the second light emitting device LED2 including the first blue light emitting layer BE, which emits blue light, and the second light emitting layer RE, which emits red light. Specifically, the first epitaxial layer EP1 and the second epitaxial layer EP2 are grown on the substrate 110 because the first green light emitting layer GE and the first blue light emitting layer BE included in the first epitaxial layer EP1 and the second epitaxial layer EP2, respectively, are easy to grow on one substrate 110, and the third epitaxial layer EP3 including the second light emitting layer RE which is grown on the temporary substrate ST is grown on the temporary substrate ST. Then, the bonding layer BD may be formed between the first and second epitaxial layers EP1 and EP2 and the third epitaxial layer EP3 to bond the third epitaxial layer EP3 onto the first and second epitaxial layers EP1 and EP2. Thereafter, the first epitaxial layer EP1, the second epitaxial layer EP2, and the third epitaxial layer EP3 may be patterned to have a plurality of patterns, and electrodes may be formed thereon, such that the plurality of light emitting devices LEDs may be formed. Accordingly, in the wafer 100 according to an exemplary embodiment of the present disclosure, light emitting devices LED including a red light emitting layer, a green light emitting layer, and a blue light emitting layer may be formed on one the substrate 110. For example, when a light emitting device including a red light emitting layer, a light emitting device including a green light emitting layer, and a light emitting device including a blue light emitting layer are transferred to a backplane after being formed on different substrates, the number of transfer processes may increase, and a misalignment may occur for each of the plurality of light emitting devices. In contrast, in the wafer 100 according to an exemplary embodiment of the present disclosure, since the plurality of light emitting devices LEDs including a red light emitting layer, a green light emitting layer, and a blue light emitting layer is formed on one substrate 110, the plurality of light emitting devices LEDs may be transferred to a backplane at once, thereby minimizing misalignments between the red light emitting layer, the green light emitting layer, and the blue light emitting layer, simplifying a transfer process, and reducing a cost.

In the wafer 100 according to an exemplary embodiment of the present disclosure, the first green light emitting layer GE and the second light emitting layer RE included in the first light emitting device LED1 may be vertically stacked, and the first blue light emitting layer BE and the second light emitting layer RE included in the second light emitting device LED2 may be vertically stacked, thereby reducing an area occupied by each of the plurality of light emitting devices LEDs. Specifically, the second light emitting layer RE, which is a red light emitting layer, may be disposed above each of the first green light emitting layer GE and the first blue light emitting layer BE, rather than being disposed on the same plane as each of the first green light emitting layer GE and the first blue light emitting layer BE, thereby reducing an area of the substrate 110 occupied by the second light emitting layer RE. If the second light emitting layer RE is disposed on the same plane as each of the first green light emitting layer GE and the first blue light emitting layer BE, it is required to secure a space for disposing the second light emitting layer RE on the substrate 110, and thus, the number of light emitting devices LEDs that can be accommodated on one substrate 110 may be restricted. In contrast, in the wafer 100 according to an exemplary embodiment of the present disclosure, the second light emitting layer RE is stacked in a vertical direction with respect to each of the first green light emitting layer GE and the first blue light emitting layer BE, thereby reducing an area occupied by the second light emitting layer RE and increasing the number of light emitting devices LEDs that can be accommodated on one substrate 110. Therefore, in the wafer 100 according to an exemplary embodiment of the present disclosure, since the light emitting layers emitting light in different colors are stacked, it is possible to reduce an area occupied by one light emitting device LED and facilitate space utilization.

Figure 5:
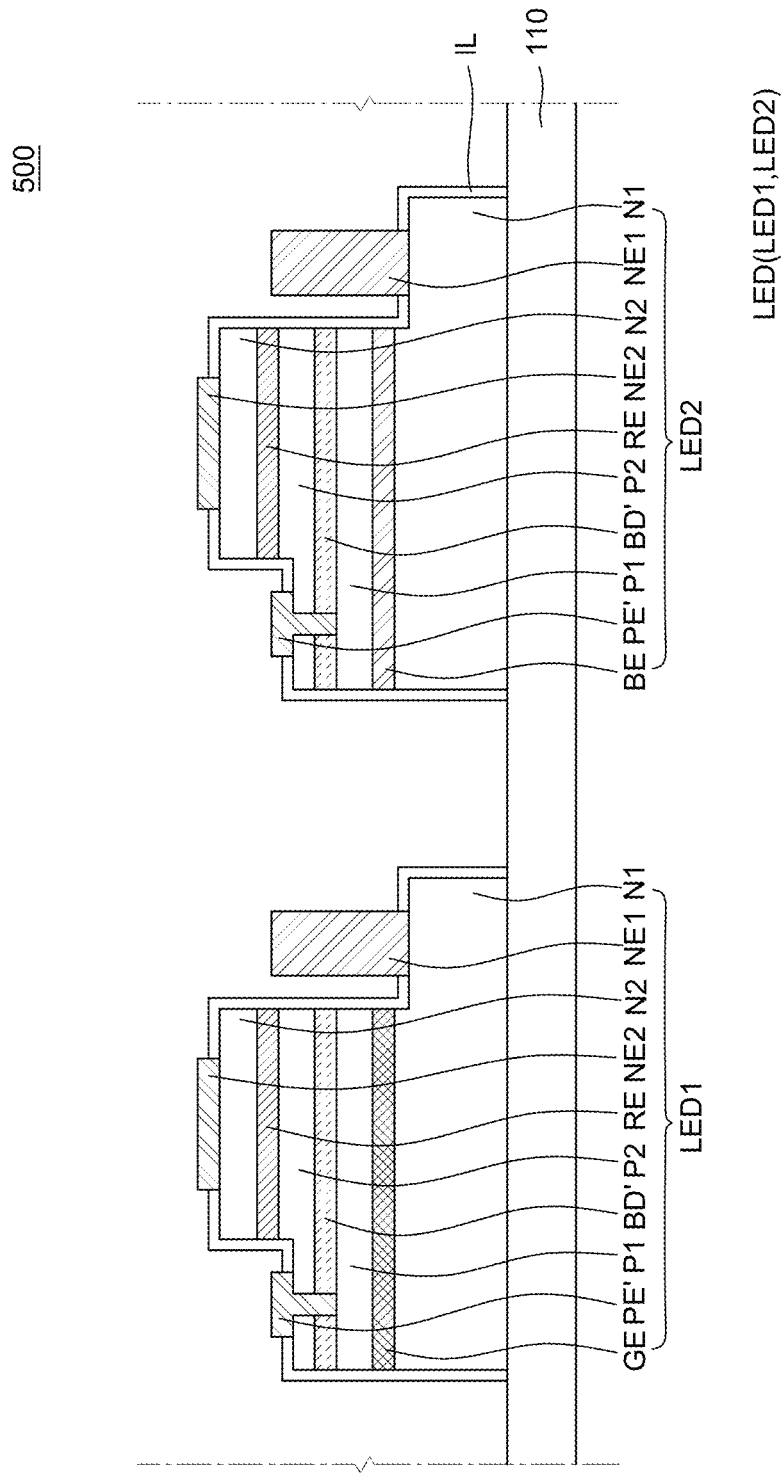
FIG. 5 is a cross-sectional view of a wafer according to another exemplary embodiment of the present disclosure.

FIG. 5 is a cross-sectional view of a wafer according to another exemplary embodiment of the present disclosure.

When compared to the wafer 100 of FIGS. 1 to 3D, the wafer 500 of FIG. 5 substantially has the same configuration, while being different only in a bonding layer BD' and a p-type electrode PE'. Thus, the overlapping description for the same configuration will be omitted.

Referring to FIG. 5, the bonding layer BD' for each of the first light emitting device LED1 and the second light emitting device LED2 may be formed of a non-conductive material having a high transmittance. The bonding layer BD' may be formed of a resin, such as benzocyclobutene (BCB), to bond the first p-type semiconductor layer P1 and the second p-type semiconductor layer P2 thereto.

When the bonding layer BD' is formed of a non-conductive material, the p-type electrode PE' may penetrate through the second p-type semiconductor layer P2 and the bonding layer BD' to be electrically connected to the first p-type semiconductor layer P1. Specifically, when the bonding layer BD' is formed of a non-conductive material, the first p-type semiconductor layer P1 and the second p-type semiconductor layer P2 disposed with the bonding layer BD' interposed therebetween may be electrically insulated from each other. Accordingly, in order to electrically connect the p-type electrode PE' disposed on the top surface of the second p-type semiconductor layer P2 to the first p-type semiconductor layer P1, contact holes for exposing the first p-type semiconductor layer P1 may be formed in the second p-type semiconductor layer P2 and the bonding layer BD', and the p-type electrode PE' may be electrically connected to the first p-type semiconductor layer P1 through the contact holes.

In the wafer 500 according to another exemplary embodiment of the present disclosure, the p-type electrode PE' may be designed according to the material of the bonding layer BD or BD'. For example, as in the wafer 100 of FIGS. 1 to 3D, when the bonding layer BD is formed of a conductive material, the p-type electrode PE may be electrically connected to both the first p-type semiconductor layer P1 and the second p-type semiconductor layer P2 by contacting the top surface of the second p-type semiconductor layer P2. In contrast, as in the wafer 500 of FIG. 5, when the bonding layer BD' is formed of a non-conductive material, a partial portion of the p-type electrode PE' may penetrate through the second p-type semiconductor layer P2 and the bonding layer BD' to be electrically connected to the first p-type semiconductor layer P1. Therefore, an electrical connection between the p-type electrode PE' and the first and second p-type semiconductor layers P1 and P2 may be designed in various manners in consideration of the material of the bonding layer BD or BD'.

The exemplary embodiments of the present disclosure can also be described as follows:

According to an aspect of the present disclosure, there is provided a light emitting device, comprising: The light emitting device includes a first n-type semiconductor layer. The light emitting device further includes a first light emitting layer disposed on the first n-type semiconductor layer. The light emitting device further includes a first p-type semiconductor layer disposed on the first light emitting layer. The light emitting device further includes a second p-type semiconductor layer disposed on the first p-type semiconductor layer. The light emitting device further includes a bonding layer disposed between the first p-type semiconductor layer and the second p-type semiconductor layer. The light emitting device further includes a second light emitting layer disposed on the second p-type semiconductor layer. The light emitting device further includes a second n-type semiconductor layer disposed on the second light emitting layer. The light emitting device further includes a p-type electrode disposed on the second p-type semiconductor layer. The light emitting device further includes a first n-type electrode disposed on the first n-type semiconductor layer. The light emitting device further includes a second n-type electrode disposed on the second n-type semiconductor layer.

A partial portion of the first n-type semiconductor layer may protrudes outward beyond the first light emitting layer, the first p-type semiconductor layer, the second p-type semiconductor layer, the second light emitting layer, and the second n-type semiconductor layer. The first n-type electrode may be disposed on the partial portion of the first n-type semiconductor layer protruding outward beyond the first light emitting layer and the second light emitting layer.

An entire portion of the second p-type semiconductor layer may overlap the first light emitting layer, a partial portion of the second p-type semiconductor layer protrudes outward beyond the second light emitting layer and the second n-type semiconductor layer. The p-type electrode may be disposed on the partial portion of the second p-type semiconductor layer protruding outward beyond the second light emitting layer.

The first n-type electrode may have a larger thickness than the second n-type electrode. The first n-type electrode may be formed of an opaque conductive material. The second n-type electrode may be formed of a transparent conductive material.

The bonding layer may be formed of a conductive material having a high transmittance. The p-type electrode is electrically connected to the first p-type semiconductor layer through the second p-type semiconductor layer and the bonding layer.

The bonding layer may be formed of a non-conductive material having a high transmittance. A partial portion of the p-type electrode may penetrate through the second p-type semiconductor layer and the bonding layer to contact the first p-type semiconductor layer.

The first light emitting layer may be a green light emitting layer or a blue light emitting layer. The second light emitting layer may be a red light emitting layer.

According to another aspect of the present disclosure, there is provided a wafer. The wafer includes a substrate. The wafer further includes a plurality of light emitting devices disposed on the substrate. Each of the plurality of light emitting devices includes a first n-type semiconductor layer disposed on the substrate. Each of the plurality of light emitting devices further includes a first light emitting layer disposed on the first n-type semiconductor layer. Each of the plurality of light emitting devices further includes a p-type semiconductor layer disposed on the first light emitting layer. Each of the plurality of light emitting devices further includes a second light emitting layer disposed on the p-type semiconductor layer. Each of the plurality of light emitting devices further includes a second n-type semiconductor layer disposed on the second light emitting layer. Each of the plurality of light emitting devices further includes a p-type electrode disposed on the p-type semiconductor layer. Each of the plurality of light emitting devices further includes a first n-type electrode disposed on the first n-type semiconductor layer. Each of the plurality of light emitting devices further includes a second n-type electrode disposed on the second n-type semiconductor layer.

The p-type semiconductor layer may include a first p-type semiconductor layer disposed on the first light emitting layer. the p-type semiconductor layer may further include a second p-type semiconductor layer disposed on the first p-type semiconductor layer. Each of the plurality of light emitting devices may further includes a bonding layer disposed between the first p-type semiconductor layer and the second p-type semiconductor layer.

An entire portion of the second p-type semiconductor layer, an entire portion of the first p-type semiconductor layer, and an entire portion of the first light emitting layer may overlap the first n-type semiconductor layer. An entire portion of the second n-type semiconductor layer and an entire portion of the second light emitting layer may overlap the second p-type semiconductor layer.

The first n-type electrode may be disposed on a partial portion of the first n-type semiconductor layer that does not overlap the first light emitting layer. The p-type electrode may be disposed on a partial portion of the second p-type semiconductor layer that does not overlap the second light emitting layer. The second n-type electrode may be disposed between the first n-type electrode and the p-type electrode on a plane.

The first n-type electrode may have a larger thickness than the second n-type electrode and the p-type electrode.

When a voltage is applied to the first n-type electrode and the p-type electrode, the first light emitting layer may emit light. when a voltage is applied to the second n-type electrode and the p-type electrode, the second light emitting layer may emit light. When a voltage is applied to the first n-type electrode, the second n-type electrode, and the p-type electrode, the first light emitting layer and the second light emitting layer may emit light.

The plurality of light emitting devices may include a first light emitting device including a first green light emitting layer emitting green light as the first light emitting layer. The plurality of light emitting devices may further include a second light emitting device including a first blue light emitting layer emitting blue light as the first light emitting layer. The first light emitting device may emit the green light from the first green light emitting layer and red light from the second light emitting layer. The second light emitting device may emit the blue light from the first blue light emitting layer and the red light from the second light emitting layer.

The first light emitting device and the second light emitting device may be alternately disposed in the same row or in the same column.

It will be apparent to those skilled in the art that various modifications and variations can be made in the light emitting device and the wafer of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting device, comprising:
   a first n-type semiconductor layer;
   a first light emitting layer disposed on the first n-type semiconductor layer;
   a first p-type semiconductor layer disposed on the first light emitting layer;
   a second p-type semiconductor layer disposed on the first p-type semiconductor layer;
   a bonding layer disposed between the first p-type semiconductor layer and the second p-type semiconductor layer;
   a second light emitting layer disposed on the second p-type semiconductor layer;
   a second n-type semiconductor layer disposed on the second light emitting layer;
   a p-type electrode disposed on the second p-type semiconductor layer;
   a first n-type electrode disposed on the first n-type semiconductor layer; and
   a second n-type electrode disposed on the second n-type semiconductor layer,
   wherein the second n-type electrode is disposed in a gap between the p-type electrode and the first n-type electrode in a plan view.

2. The light emitting device according to claim 1, wherein:
   a partial portion of the first n-type semiconductor layer protrudes outward beyond the first light emitting layer, the first p-type semiconductor layer, the second p-type semiconductor layer, the second light emitting layer, and the second n-type semiconductor layer, and
   the first n-type electrode is disposed on the partial portion of the first n-type semiconductor layer protruding outward beyond the first light emitting layer and the second light emitting layer.

3. The light emitting device according to claim 2, wherein:
   an entire portion of the second p-type semiconductor layer overlaps the first light emitting layer,
   a partial portion of the second p-type semiconductor layer protrudes outward beyond the second light emitting layer and the second n-type semiconductor layer, and
   the p-type electrode is disposed on the partial portion of the second p-type semiconductor layer protruding outward beyond the second light emitting layer.

4. The light emitting device according to claim 1, wherein the first n-type electrode has a larger thickness than the second n-type electrode.

5. The light emitting device according to claim 4, wherein:
   the first n-type electrode is formed of an opaque conductive material, and
   the second n-type electrode is formed of a transparent conductive material.

6. The light emitting device according to claim 1, wherein:
   the bonding layer is formed of a conductive material having a high transmittance, and
   the p-type electrode is electrically connected to the first p-type semiconductor layer through the second p-type semiconductor layer and the bonding layer.

7. The light emitting device according to claim 1, wherein:
   the bonding layer is formed of a non-conductive material having a high transmittance, and
   a partial portion of the p-type electrode penetrates through the second p-type semiconductor layer and the bonding layer to contact the first p-type semiconductor layer.

8. The light emitting device according to claim 1, wherein:
   the first light emitting layer is a green light emitting layer or a blue light emitting layer, and
   the second light emitting layer is a red light emitting layer.

9. A wafer, comprising:
a substrate; and
a plurality of light emitting devices disposed on the substrate,
wherein each of the plurality of light emitting devices includes:
- a first n-type semiconductor layer disposed on the substrate;
- a first light emitting layer disposed on the first n-type semiconductor layer;
- a p-type semiconductor layer disposed on the first light emitting layer;
- a second light emitting layer disposed on the p-type semiconductor layer;
- a second n-type semiconductor layer disposed on the second light emitting layer;
- a p-type electrode disposed on the p-type semiconductor layer;
- a first n-type electrode disposed on the first n-type semiconductor layer; and
- a second n-type electrode disposed on the second n-type semiconductor layer, wherein the second n-type electrode is disposed in a gap between the p-type electrode and the first n-type electrode in a plan view.

10. The wafer according to claim 9, wherein:
the p-type semiconductor layer includes:
- a first p-type semiconductor layer disposed on the first light emitting layer; and
- a second p-type semiconductor layer disposed on the first p-type semiconductor layer, the second p-type semiconductor layer covering an entire upper surface of the first p-type semiconductor layer, and each of the plurality of light emitting devices further includes a bonding layer disposed between the first p-type semiconductor layer and the second p-type semiconductor layer.

11. The wafer according to claim 10, wherein:
an entire portion of the second p-type semiconductor layer, an entire portion of the first p-type semiconductor layer, and an entire portion of the first light emitting layer overlap the first n-type semiconductor layer, and
an entire portion of the second n-type semiconductor layer and an entire portion of the second light emitting layer overlap the second p-type semiconductor layer.

12. The wafer according to claim 11, wherein:
the first n-type electrode is disposed on a partial portion of the first n-type semiconductor layer that does not overlap the first light emitting layer,
the p-type electrode is disposed on a partial portion of the second p-type semiconductor layer that does not overlap the second light emitting layer, and
the second n-type electrode is disposed between the first n-type electrode and the p-type electrode on a plane.

13. The wafer according to claim 12,
wherein the first n-type electrode has a larger thickness than the second n-type electrode and the p-type electrode.

14. The wafer according to claim 9, wherein:
the first light emitting layer is configured to emit light with a voltage applied to the first n-type electrode and the p-type electrode,
the second light emitting layer is configured to emit light with a voltage applied to the second n-type electrode and the p-type electrode, and
the first light emitting layer and the second light emitting layer are both configured to emit light with a voltage applied to the first n-type electrode, the second n-type electrode, and the p-type electrode.

15. The wafer according to claim 9, wherein:
the plurality of light emitting devices includes:
- a first light emitting device including a first green light emitting layer emitting green light as the first light emitting layer; and
- a second light emitting device including a first blue light emitting layer emitting blue light as the first light emitting layer, the second light emitting device being adjacent to and spaced apart from the first light emitting device, the first light emitting device emits the green light from the first green light emitting layer and red light from the second light emitting layer, and
the second light emitting device emits the blue light from the first blue light emitting layer and the red light from the second light emitting layer.

16. The wafer according to claim 15,
wherein the first light emitting device and the second light emitting device are alternately disposed in the same row or in the same column.

17. The wafer of claim 10, wherein:
the bonding layer covers the entire upper surface of the first p-type semiconductor layer, and
the second p-type semiconductor layer covers an entire upper surface of the bonding layer.

18. The light emitting device of claim 1, wherein:
the bonding layer covers an entire upper surface of the first p-type semiconductor layer, and
the second p-type semiconductor layer covers an entire upper surface of the bonding layer.

19. A wafer, comprising:
a substrate; and
a plurality of light emitting devices disposed on the substrate and spaced apart from one another, each of the plurality of light emitting devices including:
- a first n-type semiconductor layer on the substrate;
- a first light emitting layer on the first n-type semiconductor layer;
- a p-type semiconductor layer on the first light emitting layer;
- a second light emitting layer on the p-type semiconductor layer;
- a second n-type semiconductor layer on the second light emitting layer;
- a p-type electrode disposed on the p-type semiconductor layer;
- a first n-type electrode disposed on the first n-type semiconductor layer; and
- a second n-type electrode disposed on the second n-type semiconductor layer, wherein the second n-type electrode is disposed in a gap between the p-type electrode and the first n-type electrode in a plan view,
wherein the plurality of the light emitting devices includes a first light emitting device and a second light emitting device adjacent to and spaced apart from each other,
wherein the first light emitting layer of the first light emitting device is configured to emit a first color, and the second light emitting layer of the first light emitting device is configured to emit a second color different from the first color, and
wherein the first light emitting layer of the second light emitting device is configured to emit a third color different from the first and second colors, and the second light emitting layer of the second light emitting device is configured to emit the second color.

20. The wafer of claim 19, wherein:
the first color is one of green and blue, the second color is red, and the third color is the other of green and blue, and
the first light emitting device and the second light emitting device collectively correspond to one pixel.

* * * * *